US012640709B2

(12) United States Patent
Suzuki

(10) Patent No.: US 12,640,709 B2
(45) Date of Patent: May 26, 2026

(54) FILTER DEVICE

(71) Applicant: Murata Manufacturing Co., Ltd.,
Nagaokakyo (JP)

(72) Inventor: Hiroya Suzuki, Nagaokakyo (JP)

(73) Assignee: **MURATA MANUFACTURING CO.,
LTD.**, Kyoto (JP)

( * ) Notice: Subject to any disclaimer, the term of this
patent is extended or adjusted under 35
U.S.C. 154(b) by 97 days.

(21) Appl. No.: 18/646,892

(22) Filed: Apr. 26, 2024

(65) Prior Publication Data

US 2024/0283429 A1 Aug. 22, 2024

Related U.S. Application Data

(63) Continuation of application No.
PCT/JP2022/040938, filed on Nov. 2, 2022.

(30) Foreign Application Priority Data

Nov. 8, 2021 (JP) .................................. 2021-181711

(51) Int. Cl.
*H03H 9/60* (2006.01)
*H03H 9/54* (2006.01)
*H03H 9/58* (2006.01)
(52) U.S. Cl.
CPC ............ *H03H 9/605* (2013.01); *H03H 9/542*
(2013.01); *H03H 9/581* (2013.01)
(58) Field of Classification Search
CPC ...... H03H 9/6483; H03H 9/542; H03H 9/725;
H03H 9/14541; H03H 9/64; H03H 9/25;
(Continued)

(56) References Cited

U.S. PATENT DOCUMENTS

2014/0113571 A1 4/2014 Fujiwara et al.
2019/0190496 A1 6/2019 Nosaka
(Continued)

FOREIGN PATENT DOCUMENTS

JP 2013123270 A 6/2013
JP 2014068123 A 4/2014
(Continued)

OTHER PUBLICATIONS

International Search Report in PCT/JP2022/040938, mailed Jan. 24,
2023, 3 pages.

(Continued)

*Primary Examiner* — Lincoln D Donovan
*Assistant Examiner* — Tyler J Pereny
(74) *Attorney, Agent, or Firm* — Keating & Bennett, LLP

(57) ABSTRACT

A filter device includes at least one series arm resonator
connected in series in a signal line and including first and
second end portions, parallel arm resonators connected
between the signal line and ground, and a capacitor. The
parallel arm resonators include a first parallel arm resonator
connected on a first end portion side of the at least one series
arm resonator, and a second parallel arm resonator con-
nected on a second end portion side of the at least one series
arm resonator. The first parallel arm resonator includes a
third parallel arm resonator and a fourth parallel arm reso-
nator each connected to the first end portion. The third
parallel arm resonator is connected directly to the ground
and the fourth parallel arm resonator is connected to the
ground via the capacitor.

16 Claims, 4 Drawing Sheets

(58) Field of Classification Search
CPC ........ H03H 9/568; H03H 9/605; H03H 9/145;
H03H 7/0161; H03H 9/205; H03H
9/6403; H03H 9/02834; H03H 9/72;
H03H 7/38; H03H 9/706; H03H 9/02574;
H03H 9/14538; H03H 9/54; H03H
9/6489; H03H 9/6433; H03H 7/075
See application file for complete search history.

(56) References Cited

U.S. PATENT DOCUMENTS

| | | | | |
|---|---|---|---|---|
| 2019/0199321 A1* | 6/2019 | Nosaka | ................ | H03H 9/6483 |
| 2019/0363698 A1* | 11/2019 | Nosaka | ................. | H03H 9/725 |
| 2021/0006232 A1 | 1/2021 | Nosaka | | |

FOREIGN PATENT DOCUMENTS

| | | |
|---|---|---|
| JP | 2014120841 A | 6/2014 |
| WO | 2018043610 A1 | 3/2018 |
| WO | 2019188864 A1 | 10/2019 |

OTHER PUBLICATIONS

Written Opinion in PCT/JP2022/040938, mailed Jan. 24, 2023, 3 pages.

* cited by examiner

FILTER DEVICE

CROSS REFERENCE TO RELATED APPLICATIONS

This application claims the benefit of priority to Japanese Patent Application No. 2021-181711 filed on Nov. 8, 2021 and is a Continuation Application of PCT Application No. PCT/JP2022/040938 filed on Nov. 2, 2022. The entire contents of each application are hereby incorporated herein by reference.

BACKGROUND OF THE INVENTION

1. Field of the Invention

The present invention relates to filter devices each including a series arm resonator and parallel arm resonators.

2. Description of the Related Art

Japanese Unexamined Patent Application Publication No. 2013-123270 describes a filter including a plurality of series arm resonators and a plurality of parallel arm resonators. The plurality of series arm resonators and the plurality of parallel arm resonators are connected in a ladder form.

Each of the plurality of parallel arm resonators is individually connected between a signal line and ground. In this case, an inductor is connected in series to each of the plurality of parallel arm resonators individually.

SUMMARY OF THE INVENTION

However, in a configuration such as the one in the filter of Japanese Unexamined Patent Application Publication No. 2013-123270, in some cases, the filter characteristic is affected by the quality factor of the inductor, and the filter characteristic is degraded. More specifically, the characteristic on a lower frequency side of a pass band degrades.

Accordingly, example embodiments of the present invention provide filter devices each capable of improving characteristics on a lower frequency side of a pass band.

A filter device according to an example embodiment of the present invention includes at least one series arm resonator, a plurality of parallel arm resonators, and a capacitor. The at least one series arm resonator is connected in series in a signal line and includes a first end portion and a second end portion. The plurality of parallel arm resonators is connected between the signal line and ground.

The plurality of parallel arm resonators includes a first parallel arm resonator and a second parallel arm resonator. The first parallel arm resonator is connected on a first end portion side of the series arm resonator. The second parallel arm resonator is connected on a second end portion side of the series arm resonator. The first parallel arm resonator includes a third parallel arm resonator and a fourth parallel arm resonator, each of which is connected to the first end portion. The third parallel arm resonator is connected directly to the ground. The fourth parallel arm resonator is connected to the ground via the capacitor.

In this configuration, a parallel circuit of the third parallel arm resonator and a series circuit including the fourth parallel arm resonator and the capacitor is connected between the signal line and the ground. Because of this, it becomes possible to make a frequency difference between a resonant frequency and an anti-resonant frequency of a parallel arm resonant circuit including the parallel circuit smaller than a frequency difference between a resonant frequency and an anti-resonant frequency of the case where a single parallel arm resonator is used. Further, because the resonant frequency and the anti-resonant frequency can be adjusted, it can be brought closer to the pass band of the filter device.

According to example embodiments of the present invention, characteristics on a lower frequency side of the pass band can be improved.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

First Example Embodiment

A filter device according to the first example embodiment of the present invention is described with reference to the drawings.

Configuration of Filter Device 10

Figure 1:
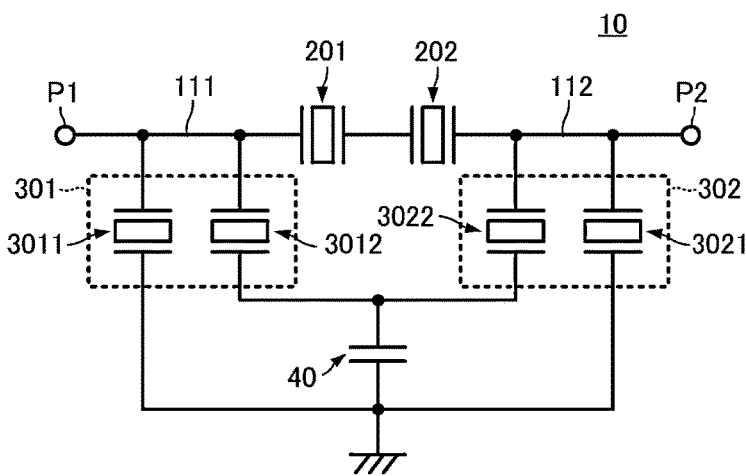
FIG. 1 is an equivalent circuit diagram of a filter device according to a first example embodiment of the present invention.

FIG. 1 is an equivalent circuit diagram of a filter device according to the first example embodiment. As illustrated in FIG. 1, a filter device 10 includes a series arm resonator 201, a series arm resonator 202, a parallel arm resonator 301, a parallel arm resonator 302, and a capacitor 40. The parallel arm resonator 301 includes a parallel arm resonator 3011 and a parallel arm resonator 3012. The parallel arm resonator 302 includes a parallel arm resonator 3021 and a parallel arm resonator 3022. The filter device 10 includes an input/output terminal P1, an input/output terminal P2, a signal line 111, a signal line 112, and ground.

The filter device 10 includes, for example, a piezoelectric substrate and a circuit board. The series arm resonator 201, the series arm resonator 202, the parallel arm resonator 301 (parallel arm resonator 3011, parallel arm resonator 3012), the parallel arm resonator 302 (parallel arm resonator 3021, parallel arm resonator 3022), and the capacitor 40 include interdigital transducer electrodes on the piezoelectric substrate. The input/output terminal P1, the input/output terminal P2, the signal line 111, the signal line 112, and the ground include electrode patterns on the piezoelectric substrate or the circuit board.

The series resonator 201 and the series arm resonator 202 are connected in series in between the input/output terminal P1 and the input/output terminal P2. In other words, the series arm resonator 201 and the series arm resonator 202 are connected in series in a signal line that connects the input/output terminal P1 and the input/output terminal P2.

A portion of the signal line that connects the input/output terminal P1 and the series arm resonator 201 is the signal line 111. A portion of the signal line that connects the input/output terminal P2 and the series arm resonator 202 is the signal line 112. An end portion of the series arm resonator 201 connected to the signal line 111 and an end portion of the series arm resonator 202 connected to the signal line 112 correspond to "first end portion of the series arm resonator" and "second end portion of the series arm resonator" referred to herein, respectively.

The parallel arm resonator 301 is set in such a manner as to be able to have a desirable resonant characteristic using the parallel arm resonator 3011 and the parallel arm resonator 3012. In other words, the parallel arm resonator 301 is divided into the parallel arm resonator 3011 and the parallel arm resonator 3012. The resonant frequency of the parallel arm resonator 3011 and the resonant frequency of the parallel arm resonator 3012 are the same. Note that here, the frequencies are the same within a range of frequency differences caused by fabrication errors.

The parallel arm resonator 301 is connected between the signal line 111 and the ground. More specifically, one end portion of the parallel arm resonator 3011 is connected to the signal line 111, and the other end portion of the parallel arm resonator 3011 is connected directly to the ground. One end portion of the parallel arm resonator 3012 is connected to the signal line 111, and the other end portion of the parallel arm resonator 3012 is connected directly to the ground via the capacitor 40. Note that "being connected directly to the ground" means being connected to the ground without going through a capacitor, and the same definition applies throughout the following description.

The parallel arm resonator 302 is set in such a manner as to be able to have a desirable resonant characteristic using the parallel arm resonator 3021 and the parallel arm resonator 3022. In other words, the parallel arm resonator 302 is divided into the parallel arm resonator 3021 and the parallel arm resonator 3022. The resonant frequency of the parallel arm resonator 3021 and the resonant frequency of the parallel arm resonator 3022 are the same. Note that here, the frequencies are the same within a range of frequency differences caused by fabrication errors.

The parallel arm resonator 302 is connected between the signal line 112 and the ground. More specifically, one end portion of the parallel arm resonator 3021 is connected to the signal line 112, and the other end portion of the parallel arm resonator 3021 is connected directly to the ground. One end portion of the parallel arm resonator 3022 is connected to the signal line 112, and the other end portion of the parallel arm resonator 3022 is connected directly to the ground via the capacitor 40.

In this configuration, the other end portion of the parallel arm resonator 3012 and the other end portion of the parallel arm resonator 3022 are connected to each other, and this node is connected to the ground via the capacitor 40.

Moreover, the signal line 111 side of the series arm resonator 201 is connected to the ground using a parallel circuit (first parallel arm resonant circuit) including the parallel arm resonator 3011 and a series circuit of the parallel arm resonator 3012 and the capacitor 40. Further, the signal line 112 side of the series arm resonator 202 is connected to the ground using a parallel circuit (second parallel arm resonant circuit) including the parallel arm resonator 3021 and a series circuit of the parallel arm resonator 3022 and the capacitor 40.

According to this configuration, the filter device 10 has the configuration in which the series arm resonator 201 and the series arm resonator 202 are connected in series in the signal line that connects the input/output terminal P1 and the input/output terminal P2. Moreover, the filter device 10 has the configuration in which the input/output terminal P1 side (signal line 111) side of the series arm resonator 201 is connected to the ground using the first parallel arm resonant circuit (the parallel arm resonator 3011, the parallel arm resonator 3012, and the capacitor 40). Furthermore, the filter device 10 has the configuration in which the input/output terminal P2 side (signal line 112) side of the series arm resonator 202 is connected to the ground using the second parallel arm resonant circuit (the parallel arm resonator 3021, the parallel arm resonator 3022, and the capacitor 40).

Note that in this configuration, for example, in the case where the parallel arm resonator 301 corresponds to "first parallel arm resonator" and the parallel arm resonator 302 corresponds to "second parallel arm resonator", the parallel arm resonator 3011 corresponds to "third parallel arm resonator", the parallel arm resonator 3012 corresponds to "fourth parallel arm resonator", the parallel arm resonator 3021 corresponds to "fifth parallel arm resonator", and the parallel arm resonator 3022 corresponds to "sixth parallel arm resonator".

On the other hand, in the case where the parallel arm resonator 301 corresponds to the "second parallel arm resonator" and the parallel arm resonator 302 corresponds to the "first parallel arm resonator", the parallel arm resonator 3011 corresponds to the "fifth parallel arm resonator", the parallel arm resonator 3012 corresponds to the "sixth parallel arm resonator", the parallel arm resonator 3021 corresponds to the "third parallel arm resonator", and the parallel arm resonator 3022 corresponds to the "fourth parallel arm resonator".

Characteristics of Filter Device 10

Figure 2:
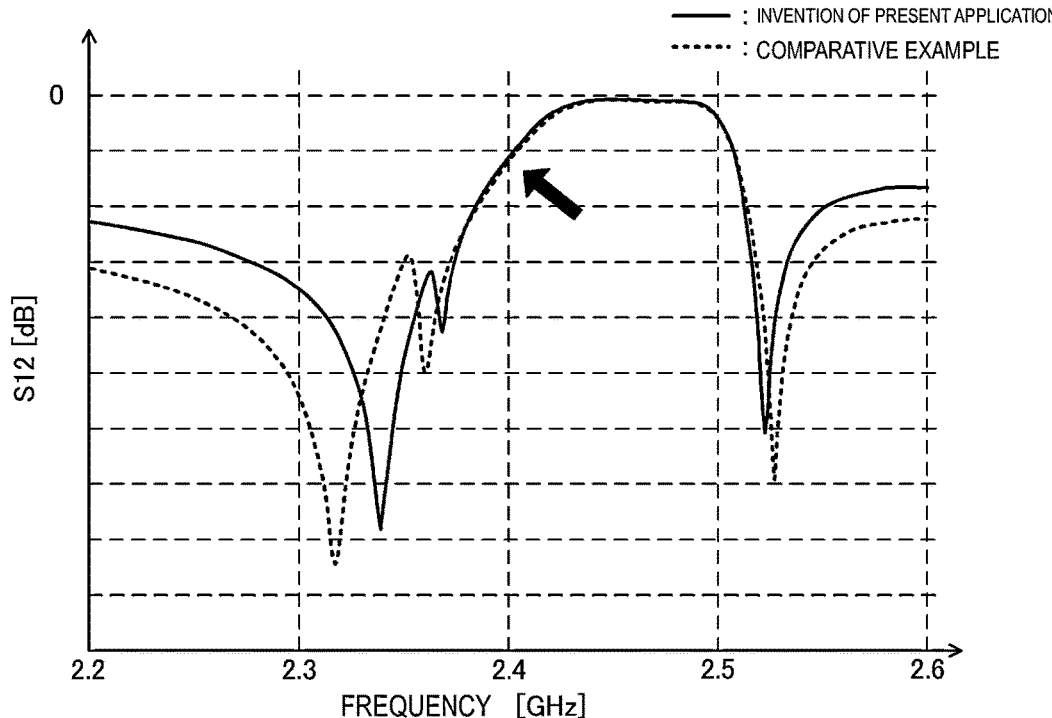
FIG. 2 is a graph illustrating bandpass characteristics (S12) of the filter device according to the first example embodiment of the present invention and a comparative example.
Figure 3:
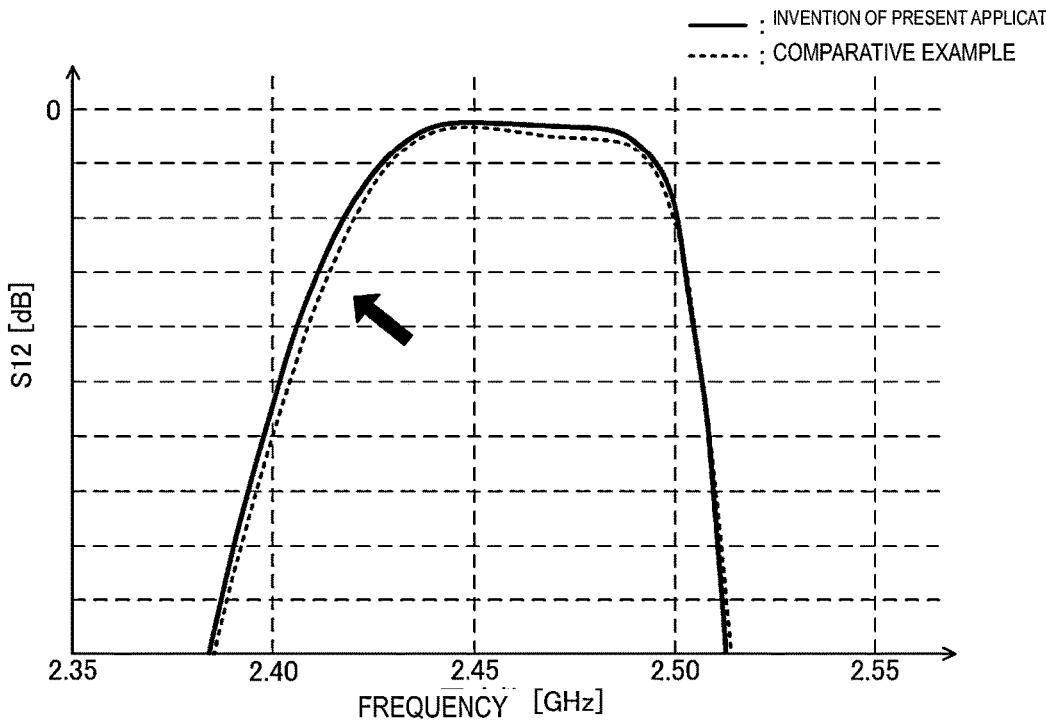
FIG. 3 is a graph expanding a frequency band including a pass band in the bandpass characteristic illustrated in FIG. 2.

FIG. 2 is a graph illustrating bandpass characteristics (S12) of the filter device according to the first example embodiment and a comparative example. In FIG. 2, the solid line denotes the characteristic of an example embodiment of the present application (filter device 10), and the dashed line denotes the characteristic of the comparative example. FIG. 3 is a graph expanding a frequency band including a pass band in the bandpass characteristic illustrated in FIG. 2. Note that the comparative example does not have a configuration such as the one in an example embodiment of the present application in which a parallel resonant element is divided but has a configuration that does not include the capacitor 40. That is to say, the comparative example has a configuration in which a single parallel arm resonator is connected between the ground and the signal line on each of two sides of the series arm resonators.

Because the filter device 10 has the configuration described above, the bandpass characteristic illustrated in FIG. 2 and FIG. 3 can be realized.

First, as a basic characteristic, a pass band in the bandpass characteristic of the filter device 10 is set using resonant frequencies of the plurality of the series arm resonators 201 and 202 and anti-resonant frequencies of the plurality of the parallel arm resonators 3011, 3012, 3021, and 3022. The attenuation characteristic on a higher frequency side of the pass band of the filter device 10 is set using anti-resonant frequencies of the plurality of the series arm resonators 201 and 202. The attenuation characteristic on a lower frequency side of the pass band of the filter device 10 is set using resonant frequencies of the plurality of the parallel arm resonators 3011, 3012, 3021, and 3022 and the capacitance of the capacitor 40.

Here, because the filter device 10 has the circuit configuration described above, as denoted by a thick arrow mark in FIG. 2 and FIG. 3, a steeper attenuation is provided on a lower frequency side of the pass band compared with the comparative example. That is to say, the amount of change in attenuation relative to the amount of change in frequency increases.

Figure 4:
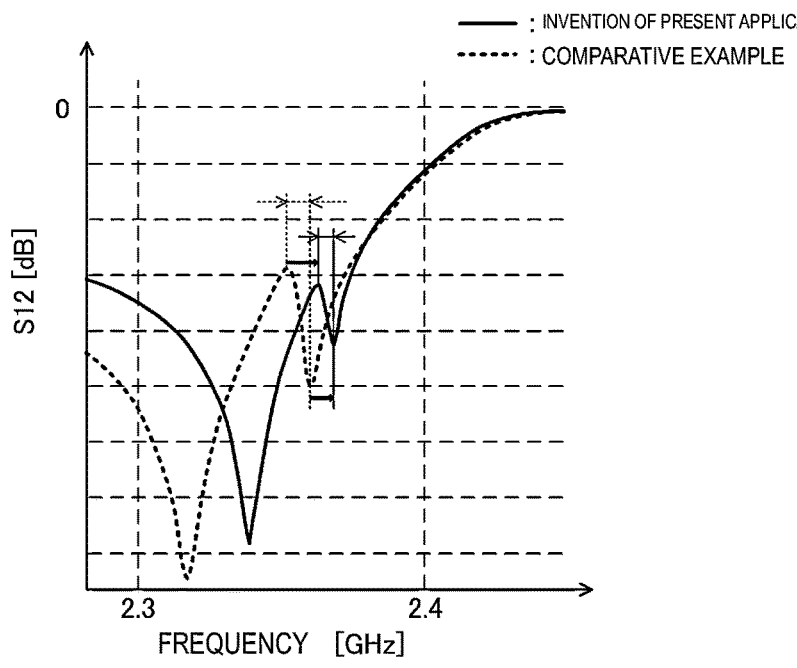
FIG. 4 is a graph expanding an attenuation characteristic on a lower frequency side of the pass band of the filter device according to the first example embodiment of the present invention.

This is because of the following reasons. FIG. 4 is a graph expanding the attenuation characteristic on the lower frequency side of the pass band of the filter device according to the first example embodiment.

As described above, the filter device 10 includes the first parallel arm resonant circuit that is the parallel circuit including the parallel arm resonator 3011 and the series circuit of the parallel arm resonator 3012 and the capacitor 40 on one end portion side of the series arm resonators 201 and 202. Further, the filter device 10 includes the second parallel arm resonant circuit that is the parallel circuit including the parallel arm resonator 3021 and the series circuit of the parallel arm resonator 3022 and the capacitor 40 on the other end portion side of the series arm resonators 201 and 202.

Because of the configuration described above, the capacitance connected in parallel to the parallel arm resonators 3011 and 3021 can be increased. Because of this, the Q factors of the first parallel arm resonant circuit and the second parallel arm resonant circuit can be increased. Accordingly, it becomes possible to improve the steepness of attenuation poles formed by the first parallel arm resonant circuit and the second parallel arm resonant circuit. Further, as denoted by arrow marks in FIG. 4, it becomes possible to move the frequencies of the attenuation poles formed by the first parallel arm resonant circuit and the second parallel arm resonant circuit closer to the pass band. As a result, the filter device 10 can increase the steepness of the attenuation characteristic on the lower frequency side of the pass band. Accordingly, the filter device 10 can improve the attenuation characteristic on the lower frequency side of the pass band.

Moreover, in the filter device 10, the capacitor 40 is connected in series to the parallel arm resonator 3012, and the capacitor 40 is connected in series to the parallel arm resonator 3022. Because of this, as illustrated in FIG. 4, the frequency difference between the resonant frequency and the anti-resonant frequency of the parallel arm resonator 3012 can be reduced. As a result, the attenuation poles formed by the first parallel arm resonant circuit and the second parallel arm resonant circuit become steeper, and the filter device 10 can improve the attenuation characteristic on the lower frequency side of the pass band.

Note that the capacitor 40 includes an interdigital transducer electrode as is the case with the plurality of the series arm resonators and the plurality of the parallel arm resonators. That is to say, the capacitor 40 includes a capacitance generated in the interdigital transducer electrode opposing each other. Because of this, the capacitor 40 can resonate depending on the direction of formation of the interdigital transducer electrode relative to the piezoelectric substrate. In this case, the resonant frequency of the capacitor 40 may be set lower than the resonant frequencies of the parallel arm resonators 3011, 3012, 3021, and 3022. Because of this, the filter device 10 can ensure the realization of the desirable attenuation characteristic described above.

Second Example Embodiment

Figure 5:
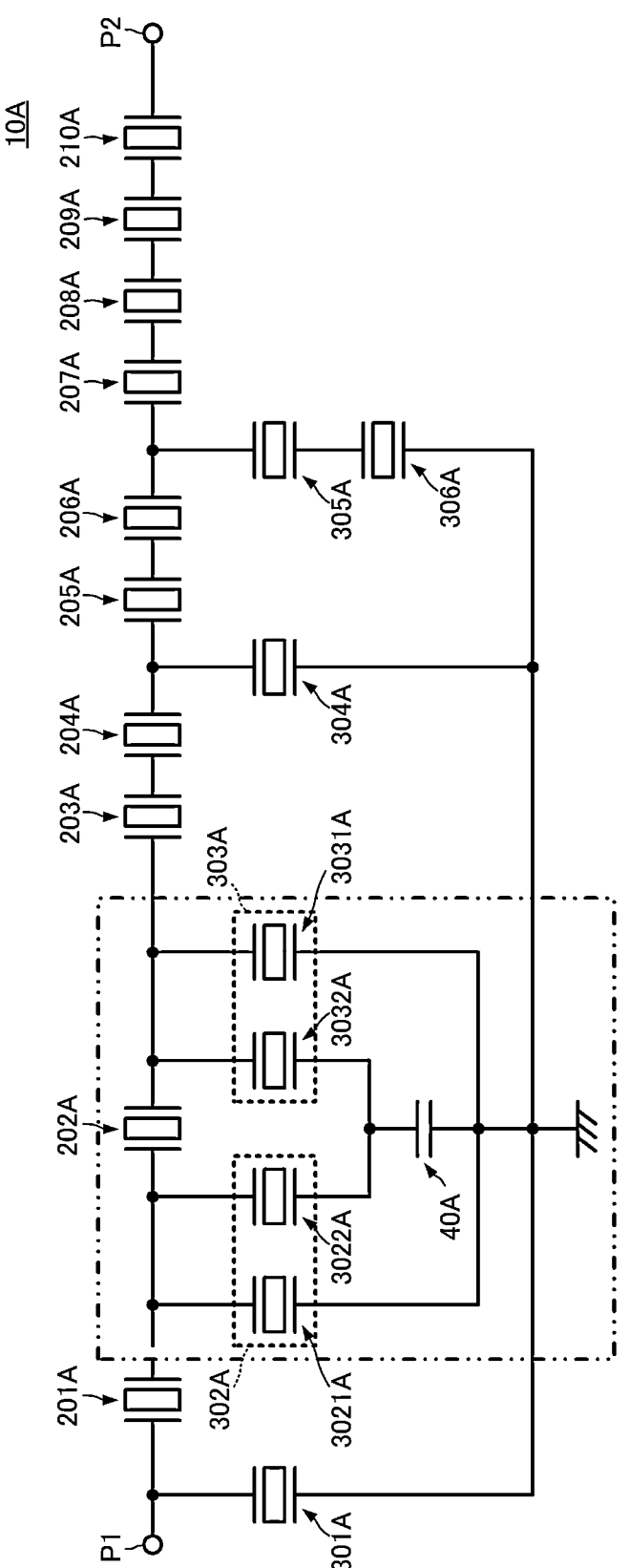
FIG. 5 is an equivalent circuit diagram of a filter device according to a second example embodiment of the present invention.
Figure 6:
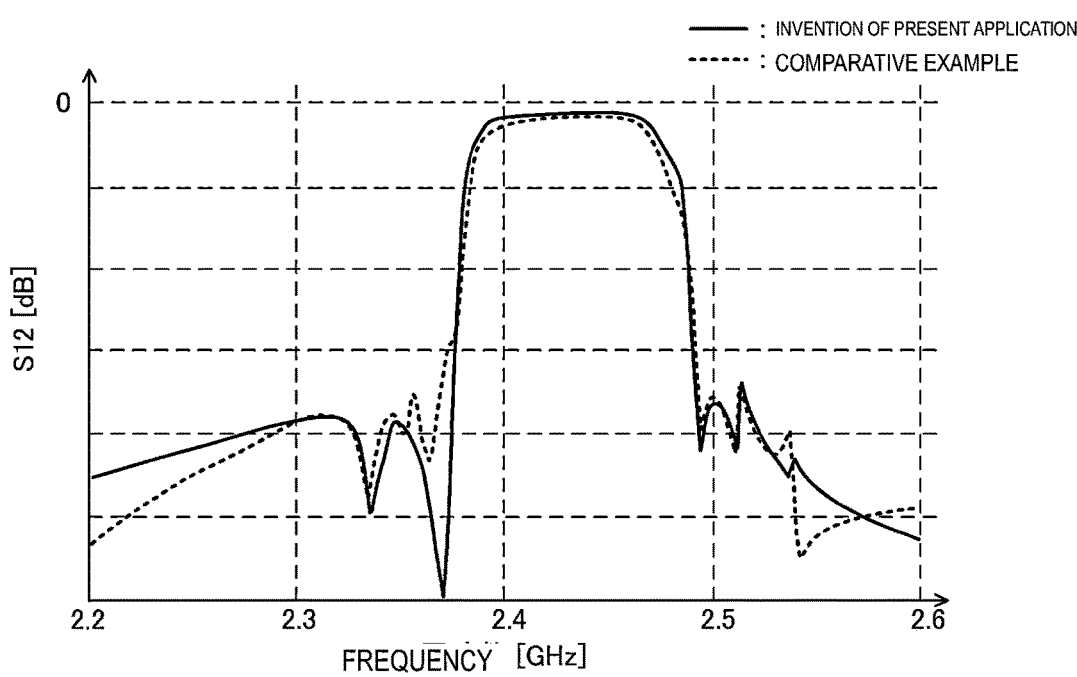
FIG. 6 is a graph illustrating bandpass characteristics (S12) of the filter device according to the second example embodiment of the present invention and a comparative example.

A filter device according to the second example embodiment of the present invention is described with reference to the drawings. FIG. 5 is an equivalent circuit diagram of the filter device according to the second example embodiment. FIG. 6 is a graph illustrating bandpass characteristics (S12) of the filter device according to the second example embodiment and a comparative example. In FIG. 6, the solid line denotes the characteristic of an example embodiment of the present application (filter device 10A), and the dashed line denotes the characteristic of the comparative example.

As illustrated in FIG. 5, the filter device 10A according to the second example embodiment is different from the filter device 10 according to the first example embodiment in including more series arm resonators and more parallel arm resonators.

The filter device 10A includes a plurality of series arm resonators 201A to 210A, a plurality of parallel arm resonators 301A to 306A, and a capacitor 40A.

The plurality of series arm resonators 201A to 210A are connected in series to each other in between the input/output terminal P1 and the input/output terminal P2. The plurality of series arm resonators 201A to 210A are connected from the input/output terminal P1 side toward the input/output terminal P2 side in the order of the series arm resonator 201A, the series arm resonator 202A, the series arm resonator 203A, the series arm resonator 204A, the series arm resonator 205A, the series arm resonator 206A, the series arm resonator 207A, the series arm resonator 208A, the series arm resonator 209A, and the series arm resonator 210A.

The parallel arm resonator 301A is connected between the ground and a signal line that connects the input/output terminal P1 and the series arm resonator 201A. The parallel arm resonator 301A is connected directly to the ground.

The parallel arm resonator 302A includes a parallel arm resonator 3021A and a parallel arm resonator 3022A. The resonant frequency of the parallel arm resonator 3021A and the resonant frequency of the parallel arm resonator 3022A are the same. That is to say, the parallel arm resonator 302A is divided into the parallel arm resonator 3021A and the parallel arm resonator 3022A.

The parallel arm resonator 3021A is connected between the ground and a signal line that connects the series arm resonator 201A and the series arm resonator 202A. The parallel arm resonator 3021A is connected directly to the ground.

The parallel arm resonator 3022A is connected between the ground and the signal line that connects the series arm resonator 201A and the series arm resonator 202A. The parallel arm resonator 3022A is connected to the ground via the capacitor 40A.

The parallel arm resonator 303A includes a parallel arm resonator 3031A and a parallel arm resonator 3032A. The resonant frequency of the parallel arm resonator 3031A and the resonant frequency of the parallel arm resonator 3032A are the same. That is to say, the parallel arm resonator 303A is divided into the parallel arm resonator 3031A and the parallel arm resonator 3032A.

The parallel arm resonator 3031A is connected between the ground and a signal line that connects the series arm resonator 202A and the series arm resonator 203A. The parallel arm resonator 3031A is connected directly to the ground.

The parallel arm resonator 3032A is connected between the ground and the signal line that connects the series arm resonator 202A and the series arm resonator 203A. The parallel arm resonator 3032A is connected to the ground via the capacitor 40A.

The parallel arm resonator 304A is connected between the ground and a signal line that connects the series arm resonator 204A and the series arm resonator 205A. The parallel arm resonator 304A is connected directly to the ground.

The parallel arm resonator 305A and the parallel arm resonator 306A are connected between the ground and a signal line that connects the series arm resonator 206A and the series arm resonator 207A. The parallel arm resonator 305A and the parallel arm resonator 306A are connected in series, the parallel arm resonator 305A is connected directly to the signal line, and the parallel arm resonator 306A is connected directly to the ground.

According to the configuration described above, the resonant frequencies of the plurality of the series arm resonators 201A to 210A and the plurality of the parallel arm resonators 301A to 306A are each appropriately set in such a way that the filter device 10A can have desirable characteristics. Further, the resonant frequency of the capacitor 40A is appropriately set in such a way that the filter device 10A can have the desirable characteristics.

In this configuration, the portion including the series arm resonator 202A, the parallel arm resonator 302A (the parallel arm resonator 3021A and the parallel arm resonator 3022A), the parallel arm resonator 303A (the parallel arm resonator 3031A and the parallel arm resonator 3032A), and the capacitor 40A produces substantially the same advantageous effects as the filter device 10 according to the first example embodiment.

Moreover, because of having this configuration, the filter device 10A can realize the bandpass characteristic illustrated in FIG. 6 and improve the attenuation characteristic on the lower frequency side of the pass band.

At this time, the resonant frequencies of the parallel arm resonator 302A (parallel arm resonators 3021A and 3022A) and the parallel arm resonator 303A (parallel arm resonators 3031A and 3032A) are higher than the resonant frequencies of the parallel arm resonators 301A, 304A, 305A, and 306A. That is to say, the resonant frequencies of the parallel arm resonator 302A (parallel arm resonators 3021A and 3022A) and the parallel arm resonator 303A (parallel arm resonators 3031A and 3032A) are closer to the pass band of the filter device 10A than the resonant frequencies of the parallel arm resonators 301A, 304A, 305A, and 306A. Because of this, the filter device 10A can ensure the improvement of the attenuation characteristic on the lower frequency side of the pass band.

Note that in the filter device 10A, the parallel arm resonators 302A and 303A respectively correspond to the "first parallel arm resonator" and the "second parallel arm resonator", the parallel arm resonator 3021A and the parallel arm resonator 3031A respectively correspond to the "third parallel arm resonator" and the "fifth parallel arm resonator", and the parallel arm resonator 3022A and the parallel arm resonator 3032A respectively correspond to the "fourth parallel arm resonator" and the "sixth parallel arm resonator". Moreover, the parallel arm resonators 301A, 304A, 305A, and 306A correspond to "seventh parallel arm resonators".

Note that the foregoing circuit configuration illustrated in FIG. 5 is an example. Provided that at least the circuit configuration that corresponds to the filter device 10 (for example, in the filter device 10A, the portion including the series arm resonator 202A, the parallel arm resonator 302A (the parallel arm resonator 3021A and the parallel arm resonator 3022A), the parallel arm resonator 303A (the parallel arm resonator 3031A and the parallel arm resonator 3032A), and the capacitor 40A) is included, the configuration of other series arm resonators and other parallel arm resonators can be appropriately set in such a way that a filter device can realize desirable characteristics.

Further, in the configurations of the respective example embodiments described above, examples are illustrated in which each of the parallel arm resonators on both sides of the series arm resonator is divided. However, even with a configuration in which the parallel arm resonator on a first end portion side of the series arm resonator is divided and the parallel arm resonator on a second end portion side of the series arm resonator is not divided, or a configuration in which the parallel arm resonator on the second end portion side of the series arm resonator is divided and the parallel arm resonator on the first end portion side of the series arm resonator is not divided, substantially the same advantageous effects can be produced.

Further, the description described above is provided for the cases where the capacitors 40 and 40A each have the structure in which an interdigital transducer electrode is provided on a piezoelectric body. However, each of the capacitors 40 and 40A can be provided by a chip-type electronic component mounted on a circuit board, planar electrode patterns on a circuit board, or the like. As described above, by forming the capacitors 40 and 40A in various shapes, it becomes possible to widen the ranges of capacitances of the capacitors 40 and 40A. Accordingly, it becomes possible to realize a more variety of filter characteristics, and the filter devices 10 and 10A can each ensure the improvement of the attenuation characteristic on the lower frequency side of the pass band.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   at least one series arm resonator connected in series in a signal line, the at least one series arm resonator including a first end portion and a second end portion;
   a plurality of parallel arm resonators connected between the signal line and ground; and
   a capacitor; wherein
   the plurality of parallel arm resonators includes:
      a first parallel arm resonator connected on a first end portion side of the at least one series arm resonator; and
      a second parallel arm resonator connected on a second end portion side of the at least one series arm resonator;
   the first parallel arm resonator includes:
      a third parallel arm resonator and a fourth parallel arm resonator each connected to the first end portion;
   the third parallel arm resonator is connected directly to the ground;
   the fourth parallel arm resonator is connected to the ground via the capacitor; and the capacitor has a structure having a resonant frequency lower than resonant frequencies of the third parallel arm resonator and the fourth parallel arm resonator.

2. A filter device comprising:

at least one series arm resonator connected in series in a signal line, the at least one series arm resonator including a first end portion and a second end portion;

a plurality of parallel arm resonators connected between the signal line and ground; and a capacitor; wherein the plurality of parallel arm resonators includes:

a first parallel arm resonator connected on a first end portion side of the at least one series arm resonator; and a second parallel arm resonator connected on a second end portion side of the at least one series arm resonator;

the first parallel arm resonator includes:

a third parallel arm resonator and a fourth parallel arm resonator each connected to the first end portion;

the third parallel arm resonator is connected directly to the ground;

the fourth parallel arm resonator is connected to the ground via the capacitor;

the second parallel arm resonator includes:

a fifth parallel arm resonator and a sixth parallel arm resonator each connected to the second end portion;

the fifth parallel arm resonator is connected directly to the ground; and the sixth parallel arm resonator is connected to the ground via the capacitor.

3. The filter device according to claim 2, further comprising:

a seventh parallel arm resonator that is different from the first parallel arm resonator and the second parallel arm resonator; wherein resonant frequencies of the third parallel arm resonator and the fourth parallel arm resonator are lower than a pass band of the filter device and higher than a resonant frequency of the seventh parallel arm resonator.

4. The filter device according to claim 2, further comprising:

a seventh parallel arm resonator that is different from the first parallel arm resonator and the second parallel arm resonator; wherein resonant frequencies of the third parallel arm resonator, the fourth parallel arm resonator, the fifth parallel arm resonator, and the sixth parallel arm resonator are lower than a pass band of the filter device and higher than a resonant frequency of the seventh parallel arm resonator.

5. A filter device comprising:

at least one series arm resonator connected in series in a signal line, the at least one series arm resonator including a first end portion and a second end portion;

a plurality of parallel arm resonators connected between the signal line and ground; and a capacitor; wherein the plurality of parallel arm resonators includes:

a first parallel arm resonator connected on a first end portion side of the at least one series arm resonator; and a second parallel arm resonator connected on a second end portion side of the at least one series arm resonator;

the first parallel arm resonator includes:

a third parallel arm resonator and a fourth parallel arm resonator each connected to the first end portion;

the third parallel arm resonator is connected directly to the ground;

the fourth parallel arm resonator is connected to the ground via the capacitor; and a resonant frequency of the third parallel arm resonator and a resonant frequency of the fourth parallel arm resonator are equal.

6. The filter device according to claim 2, wherein the capacitor has a structure having a resonant frequency lower than resonant frequencies of the third parallel arm resonator and the fourth parallel arm resonator.

7. The filter device according to claim 2, wherein a resonant frequency of the third parallel arm resonator and a resonant frequency of the fourth parallel arm resonator are equal; and a resonant frequency of the fifth parallel arm resonator and a resonant frequency of the sixth parallel arm resonator are equal.

8. The filter device according to claim 2, wherein the capacitor has a structure having a resonant frequency lower than resonant frequencies of the third parallel arm resonator, the fourth parallel arm resonator, the fifth parallel arm resonator, and the sixth parallel arm resonator.

9. The filter device according to claim 1, wherein the at least one series arm resonator, the plurality of parallel arm resonators, and the capacitor include interdigital transducer electrodes.

10. The filter device according to claim 1, further comprising a piezoelectric substrate and a circuit board.

11. The filter device according to claim 10, wherein interdigital transducer electrodes are provided on the piezoelectric substrate to define the at least one series arm resonator, the plurality of parallel arm resonators, and the capacitor.

12. The filter device according to claim 10, wherein electrode patterns are provided on the piezoelectric substrate to define the signal line and the ground.

13. The filter device according to claim 1, wherein the capacitor is a chip electronic component.

14. The filter device according to claim 10, wherein the capacitor is a chip electronic component mounted on the piezoelectric substrate.

15. The filter device according to claim 1, wherein the capacitor includes planar electrode patterns.

16. The filter device according to claim 10, wherein the capacitor includes planar electrode patterns provided on the piezoelectric substrate.

* * * * *